United States Patent [19]

Hammer

[11] Patent Number: 4,872,176
[45] Date of Patent: Oct. 3, 1989

[54] DEVICE AND METHOD FOR MONITORING A LIGHT-EMITTING DEVICE

[75] Inventor: Jacob M. Hammer, Princeton Borough, N.J.

[73] Assignee: General Electric Company, Schenectady, N.Y.

[21] Appl. No.: 184,843

[22] Filed: Apr. 25, 1988

[51] Int. Cl.$^4$ ............................ H01S 3/05; H01S 3/19
[52] U.S. Cl. ...................................... 372/50; 357/17; 372/96; 372/108
[58] Field of Search ...................... 357/17, 19; 372/50, 372/96, 108, 29

[56] References Cited

U.S. PATENT DOCUMENTS

| | | | |
|---|---|---|---|
| 3,753,801 | 8/1973 | Lockwood et al. | 148/171 |
| 4,156,206 | 5/1979 | Comerford et al. | 372/108 |
| 4,532,632 | 7/1985 | Yamashita et al. | 372/96 |
| 4,701,930 | 10/1987 | Akiba et al. | 372/96 |

OTHER PUBLICATIONS

Phase Locked Operation of Coupled Pairs of Grating-Surface-Emitting Diode Lasers, by J. M. Hammer et al., Appl. Phys. Lett., vol. 50, No. 11, Mar. 16, 1987, pp. 659–661.
Phase Locked Operation of a Grating-Surface-Emitting Diode Laser Array, by N. W. Carlson et al., Appl. Phys. Lett., vol. 50, No. 19, May 11, 1987, pp. 1301–1303.
Efficient 30 mW Grating Surface-Emitting Lasers, by G. A. Evans et al., Appl. Phys. Lett., vol. 51, No. 19, Nov. 9, 1987, pp. 1478–1480.
Surface-Emitting Second Order Distributed Bragg Reflector Laser with Dynamic Wavelength Stabilization and Far-Field Angle of 0.25°, by G. A. Evans et al., Appl. Phys. Lett., vol. 49, No. 6, Aug. 11, 1986, pp. 314–315.

Primary Examiner—James W. Davie
Attorney, Agent, or Firm—Henry I. Steckler; James C. Davis, Jr.; Paul R. Webb, II

[57] ABSTRACT

A light emitting device which has a substrate and a cavity region overlying the substrate. The cavity region has a grating region overlying exposed portions of the surface formed of a first grating region having a first period and a second grating region having a period different from the first region. On other portions of the cavity region an active region overlies the cavity layer and a capping layer overlies the active region. The device is monitored by forming a surface emitting device with first and second gratings with the gratings having different periods. Current is applied to the device such that radiation is emitted from the grating and the output is detected from the second grating such that the current to the device is adjusted based on the output of the second grating.

14 Claims, 2 Drawing Sheets

DEVICE AND METHOD FOR MONITORING A LIGHT-EMITTING DEVICE

This invention was made with Government support under Contract No. F29601-85-C-0019 awarded by the Department of the Air Force. The Government has certain rights in this invention.

The invention relates to a device and method for monitoring the output of surface emitting devices.

BACKGROUND OF THE INVENTION

One type of construction of a surface emitting device uses a grating surface in a large optical cavity index-guided laser. These devices may be formed on a single substrate to form an array of devices which emit a radiation pattern which is typically about perpendicular to the grating surface. The output of these arrays are typically monitored by inserting a detecting device, such as an array of charge-coupled devices in this radiation pattern. This monitoring is initially required to adjust drive currents to produce a desired far field pattern and further monitoring is typically necessary to adjust the drive currents to compensate for changes in ambient conditions and to compensate for the aging of the device. Therefore, it would be desirable to have a light emitting device and a method of monitoring the device in which the monitoring equipment is not inserted in the primary radiation pattern.

SUMMARY OF THE INVENTION

A surface emitting device comprises a substrate having a large optical cavity region overlying the substrate. The large optical cavity region has both exposed and unexposed areas. Overlying the unexposed areas are an active region and a capping layer overlying the active region. Overlying the exposed area of the large optical cavity region is a grating region formed of a first grating region having a first period and a second region having a period different from the first region.

The invention also includes an array of surface emitting devices. This array has a substrate, a large optical cavity region overlying the substrate, a first active region overlying a first portion of the cavity region and a second active region overlying a second portion of the cavity region. Capping layers overlie the active regions and the device includes a means for electrically contacting the substrate and capping layers. A first grating region overlies the cavity region and the grating region is formed of a plurality of substantially equally spaced elements. A second grating region also overlies the cavity region which has a plurality of elements which have a spacing different from said first grating region.

Finally, the invention includes a method of monitoring the light emitting device which includes forming a surface emitting device with first and second gratings with the grating having different periods. Current is applied to the device such that radiation is emitted from the grating and the output is detected from the second grating such that the current to the device is adjusted based on the output of the second grating.

DETAILED DESCRIPTION OF PREFERRED EMBODIMENTS

Figure 2:
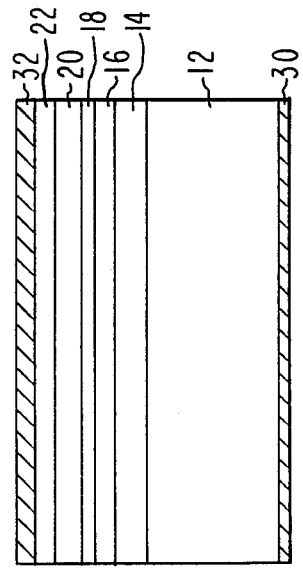
FIG. 2 is a cross-sectional view of a laser used in FIG. 1.
Figure 1:
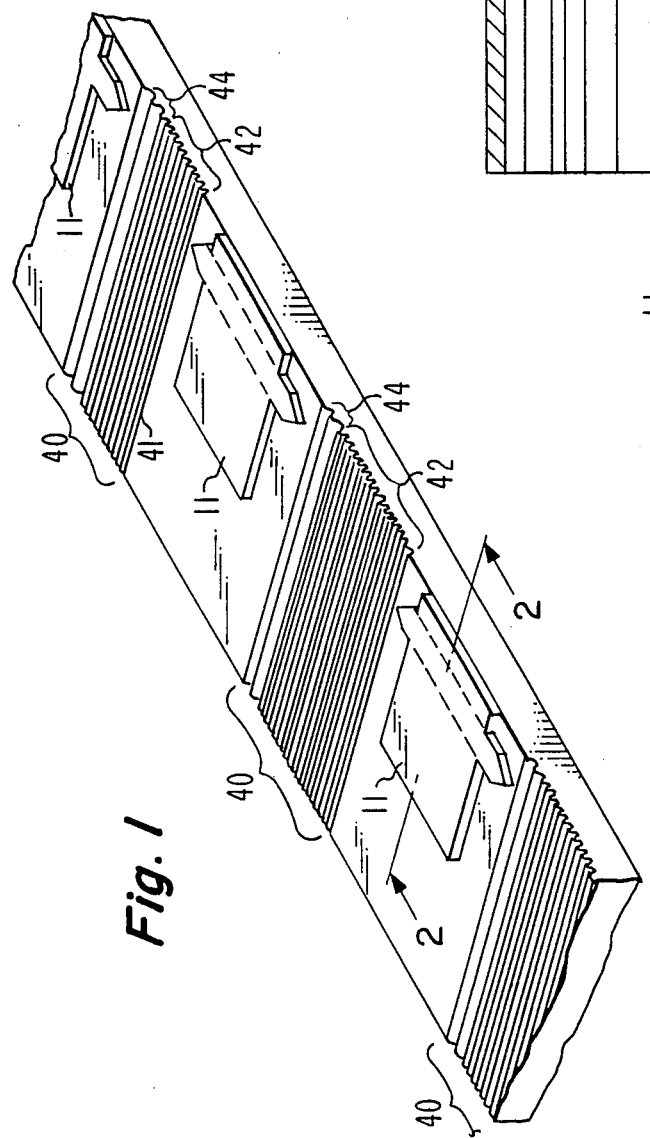
FIG. 1 is an isometric view of an array in accordance with the invention.
Figure 3:
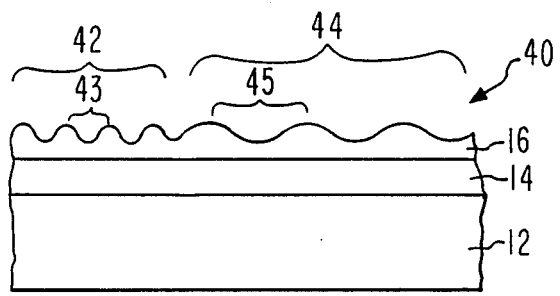
FIG. 3 is a cross-sectional view of a firt embodiment of a grating used in the array of FIG. 1.

In FIG. 1 a surface emitting array 10 comprises a plurality of semiconductor diode sections 11. As shown in FIG. 2, these diode sections 11 comprise a substrate 12 having a first cladding region 14 thereon. A large optical cavity region 16 overlies the first cladding region 14, an active region 18 overlies the large optical cavity region 16, a second cladding region 20 overlies the active region 18, and a capping layer 22 overlies the second cladding region 20. A means for electrically contacting the device comprises a first electrical contact 30 which overlies the surface of the substrate 12, opposite the first cladding region 14 and a second electrical contact 32 which overlies the capping layer 22. In the array of FIG. 1 the diode sections 11 are connected together by the cavity region 16 which extends between the diode sections 11 and overlying the cavity region 16 between the diode sections is a grating region 40. The grating region 40 typically is composed of a plurality of substantially parallel elements 41 formed on the surface of the cavity region 16. As shown in FIG. 3 the grating region 40 comprises a first output grating 42 with the gratings having a substantially equal period 43 and a second monitor grating 44 with each monitor grating period 45 being different than the output grating period 43. It should be understood the output and monitor gratings 42 and 44 respectively may be adjacent as in FIG. 3. Alternatively, other grating systems may be used as in FIG. 4 in which a portion of the output grating 42 is positioned on the monitor grating 44 such that output grating 42 is a modulation on the monitor grating 44.

The substrate 12 is typically composed of N-type GaAs about 250 micrometers ($\mu$m) thick and having a first major surface parallel to or slightly misoriented from the (100) cyrstallographic plane. The first cladding region 14 is typically about 1.26 $\mu$m thick and is typically composed of N-type $Al_xGa_{1-x}As$ where x is generally between about 0.2 and 0.4 and is typically about 0.27 $\mu$m. The cavity region 16 is typically between about 0.25 and 0.60 $\mu$m thick and is typically composed of N-type $Al_xGa_{1-x}As$ where x is generally between about 0.15 and 0.25 and is typically about 0.18. The active region 18 is typically about 0.08 $\mu$m thick and is typically composed of N-type $Al_xGa_{1-x}As$ where x is typically about 0.06. The second cladding region 20 is typically between about 1.2 and 1.7 $\mu$m thick and is typically composed of $Al_xGa_{1-x}As$ where x is about 0.4. The first electrical contact 30 is preferably composed of sequentially deposited germanium, gold nickel and gold layers. The second electrical contact 32 is preferably composed of titanium, platinum and gold layers which are sequentially deposited onto a Zn or Cd diffused surface. It should be understood that other surface emitting device structures which utilize a surface grating are equally applicable to the present invention.

Figure 4:
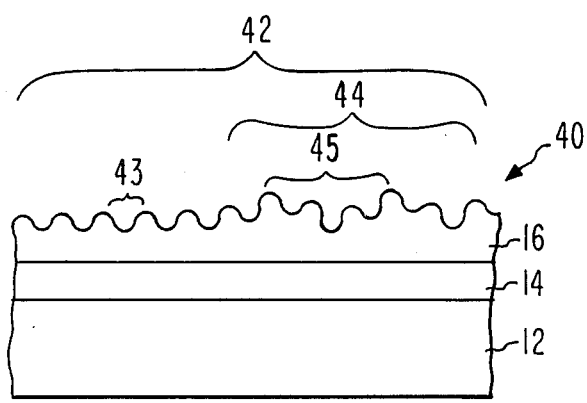
FIG. 4 is a cross-sectional view of a second embodiment of a grating used in the array of FIG. 1.

The array 10 may be fabricated using standard liquid phase epitaxy techniques to deposit the layers and regions. Suitable liquid phase epitaxy techniques have been disclosed by Lockwood et al. in U.S. Pat. No. 3,753,801 incorporated herein by reference. Photoresist is then formed on the diode sections 11 and the second electrical contact 32 is then removed by ion milling outside the diode sections 11. The capping layer 22, second cladding region 20 and active region 18 are then removed outside the diode sections 11 typically by a chemical removal such as by a buffered HF solution and $H_2SO_4:H_2O_2:H_2O$. The grating region is typically formed by first forming the output grating 42 by forming a periodic grating using standard holographic and etching techniques. Alternatively, the grating may be formed by ion milling. Typically the period of the output grating 43 is about 240 nanometers (nm). It should be understood that it may be desirable to first form the monitor grating 44 to form other configurations such as shown in FIG. 4. The monitor grating 44 is formed by the same techniques to have a periodic length different than the output grating so that the angle of the optical axis emitted radiation from the monitor grating 44 relative to the plane of the layers is different than the angle of the optical axis of the emitted radiation from the output grating 42. Preferably the periodic length of the monitor grating 44 is larger than the periodic length of the output grating 42. Typically, the angle of output $\phi$ from the monitor grating measured from the surface will be about $$\phi = COS^{-1}[(n_e\Lambda - \lambda m_c)/(n_o\Lambda)]$$

where $\lambda$ is the wavelength of radiation, $m_c$ is an integer constant (1, 2, 3 . . . ), $\Lambda$ is the period of the monitor grating, $n_e$ is the effective index of refraction in the large optical cavity region and $n_o$ is the effective index of refraction in air. $\Lambda$ may be about 375 nm such that $\phi$ will be about 10°.

In operation, a bias voltage of the proper polarity is applied to the first and second electrical contacts 30 and 32 respectively, producing radiation in the active region 18. This radiation is emitted in part by the output grating 42. The angle of the optical axis of emitted radiation is typically perpendicular to the plane of the layers. A portion of the radiation is also emitted from the monitor grating. A detecting device such as an array of CCD detectors, as is well known in the art, is positioned to receive radiation from the monitor grating and the plane of the detecting device is typically perpendicular to the optical axis of emitted radiation from the monitor grating. The detecting device transmits electrical signals to a viewing device, which depicts the output from the monitor grating. This output from the monitor grating 44 will have a unique relationship with the output of the output grating 42 since each is subject to the same interference conditions. For example, in some device configurations a single lobe from the output of the monitor grating 44 would correspond to a single lobe from the output grating. It should be understood that this unique relationship is not necessarily the same pattern for the output and monitor gratings 42 and 44 respectively, and is therefore typically determined experimentally through trial and error by first monitoring outputs from both gratings. Therefore, the current supplied to the device will be adjusted to initially desired drive currents by observing the output of the monitor grating 44 and will be subsequently adjusted to adjust for compensation of aging or changes in ambient conditions.

What is claimed is:

1. A surface emitting device comprising:
   a substrate;
   a large optical cavity region overlying the substrate having first and second areas;
   an active region overlying said first area of the large optical cavity region;
   a capping layer overlying said active region;
   means for electrically contacting said substrate and said capping layer;
   a grating region overlying said second area of said large optical cavity region having a first grating region having a first periodic length and a second grating region having a periodic length different from said first grating region.

2. The device of claim 1 wherein said device is a laser.

3. The device of claim 1 wherein said device is an array of radiation emitting devices.

4. The device of claim 1 wherein the period of said second grating region is greater than the period of said first grating region.

5. The device of claim 1 wherein said second grating region is adjacent said first grating region.

6. The device of claim 1 wherein at least a portion of said first grating region overlies at least a portion of said second grating region.

7. An array of surface emitting devices comprising:
   a substrate;
   a large optical cavity region overlying the substrate;
   a first active region overlying a first portion of the large optical cavity region;
   a second active region overlying a second portion of the large optical cavity region;
   a first capping layer overlying said first active region;
   a second capping layer overlying said second active region;
   means for electrically contacting said substrate and said first and second capping layers;
   a first grating region overlying said large optical cavity region between said first and second active regions, said first grating region formed of a plurality of substantially equally spaced grating elements;
   a second grating region overlying said large optical cavity region, said first grating region formed of a plurality of elements which have a spacing between elements different from said first grating region.

8. The array of claim 7 wherein said array is a laser array.

9. The array of claim 7 wherein said first grating region is adjacent said second grating region.

10. The array of claim 7 wherein at least a portion of said first grating region overlies at least a portion of said second grating region.

11. The array of claim 7 wherein said second grating has a spacing between elements greater than said first grating.

12. A method for monitoring the output of a light emitting device comprising the steps of:
   forming a surface emitting device having a first grating where radiation is emitted having about the same period between elements and a second grating having a period different from said first grating, said device having an active region and a means for electrically contacting the device;
   applying current to said device such that radiation is emitted from said first and second gratings;
   detecting said output from said second grating;
   adjusting the current to said device based on the detected output of said second grating.

13. The method of claim 12 wherein said surface emitting device is an array and the step of detecting said output further comprises the step of detecting the output from the array.

14. The method of claim 12 wherein the output of said second grating has an optical axis of emitter radiation, the step of detecting said output further comprises the steps of:

positioning a detecting device having a substantially planar receiving surface such that said receiving surface is about perpendicular to the optical axis of emitted radiation.

* * * * *